(12) United States Patent
Cho

(10) Patent No.: US 6,337,815 B1
(45) Date of Patent: Jan. 8, 2002

(54) SEMICONDUCTOR MEMORY DEVICE HAVING REDUNDANT CIRCUIT

(75) Inventor: Shizuo Cho, Miyazaki (JP)

(73) Assignee: Oki Electric Industry Co., Ltd., Tokyo (JP)

( * ) Notice: Subject to any disclaimer, the term of this patent is extended or adjusted under 35 U.S.C. 154(b) by 0 days.

(21) Appl. No.: 09/357,927

(22) Filed: Jul. 21, 1999

(30) Foreign Application Priority Data

Jul. 30, 1998 (JP) .......................................... 10-215170

(51) Int. Cl.[7] .................... H01L 27/10; H01L 27/108; G11C 7/00; G11C 16/04; G11C 11/062; G11C 8/00
(52) U.S. Cl. ..................... 365/200; 257/209; 257/300; 257/235; 257/907; 365/195; 365/185.17; 365/199; 365/230.06; 365/330.01; 365/240
(58) Field of Search ................................. 257/300, 209, 257/907, 235; 326/10, 104; 361/242, 239; 365/195, 185.17, 199, 230.06, 330.01, 200, 240

(56) References Cited

U.S. PATENT DOCUMENTS

| | | | |
|---|---|---|---|
| 4,975,597 A | | 12/1990 | Houston |
| 4,989,181 A | * | 1/1991 | Harada ........................ 365/200 |
| 5,206,831 A | * | 4/1993 | Wakamatsu .................. 365/200 |
| 5,396,471 A | * | 3/1995 | Kitsu ..................... 365/230.01 |
| 5,485,425 A | * | 1/1996 | Iwai et al. .................... 365/200 |
| 5,555,212 A | * | 9/1996 | Toshiaki et al. ............. 365/200 |
| 5,640,365 A | * | 6/1997 | Imamiya et al. ............ 365/236 |
| 5,740,114 A | * | 4/1998 | Hirano et al. ................ 365/200 |

FOREIGN PATENT DOCUMENTS

| | | | |
|---|---|---|---|
| EP | 0486295 A2 | * | 11/1991 |
| EP | 0496282 A2 | * | 1/1992 |
| JP | 8-31195 | | 2/1996 |
| JP | 8-83496 | | 3/1996 |

* cited by examiner

*Primary Examiner*—Stephen D. Meier
*Assistant Examiner*—James Mitchell
(74) *Attorney, Agent, or Firm*—Volentine Francos, P.L.L.C.

(57) ABSTRACT

A semiconductor memory device includes word lines, normal bit lines, a redundant bit line, and normal memory cells for storing data and each of which is coupled to one of the word lines and to one of the normal bit lines. The device also includes redundant memory cells each of which is coupled to one of the word lines and to the redundant bit line. The device further includes a coincidence circuit that receives a first address signal, indicating an address of one of the normal bit lines, and a second address signal, indicating an address of one of the normal bit lines to which a defective memory cell is coupled, and which selects the redundant bit line when the first address signal coincides with the second address signal. A logic circuit included in the device also receives the first address signal and the second address signal and selects one of the normal bit lines according to the first address signal, but is inhibited from selecting the normal bit line coupled to the defective memory cell identified by the second address signal.

19 Claims, 5 Drawing Sheets

SEMICONDUCTOR MEMORY DEVICE HAVING REDUNDANT CIRCUIT

BACKGROUND OF THE INVENTION

1. Field of the Invention

The present invention generally relates to a redundant circuit, and more particularly, to a redundant circuit for a Dynamic Random Access Memory (DRAM).

This application relies for priority on Japanese patent application, Serial Number 215170/1998, filed Jul. 30, 1998, which is incorporated herein by reference in its entirety.

2. Description of the Related Art

As memory capacity and memory density of semiconductor memory devices have increased in recent years, such devices have been provided with both redundant memory cells and normal memory cells. If one of the normal memory cells has a defect, the redundant memory cell is substituted for the defective normal memory cell. As a result, a faulty chip may be repaired or fixed. In this technical field, the technique mentioned above is widely used.

In a conventional semiconductor memory device, which has a redundant memory cell, there is a possibility that a column line associated with the defective memory cell and a redundant column line associated with the redundant memory cell are activated at the same time. Therefore, it is necessaty to delay the time when the redundant column line is activated so that the defective memory cell and data of the redundant memory cell are not read out to a data bus at the same time. As a result, an access time of the semiconductor memory device is increased.

Consequently, there has been a need for an improved semiconductor memory device.

SUMMARY OF THE INVENTION

It is an object of the present invention to provide a semiconductor memory device that may reduce an access time when a redundant column line is activated.

It is another object of the present invention to provide a semiconductor memory device that has a reduced chip area.

It is another object of the present invention to provide a semiconductor memory device that may reduce the number of defect column address signal lines.

According to one aspect of the present invention, for achieving one or more of the above objects, a semiconductor memory device is provided that includes word lines, normal bit lines, and a redundant bit line. The semiconductor memory device also includes normal memory cells, each of which is coupled to one of the word lines and one of the normal bit lines, and each of which stores data. The semiconductor memory device also includes redundant memory cells, each of which is coupled to one of the word lines and the redundant bit line. The semiconductor memory device further includes a first address signal output circuit outputting a first address signal that indicates an address of one of the normal bit lines, a second address signal output circuit outputting a second address signal indicating an address of one of the normal bit lines in which a defective memory cell is coupled, and a coincidence circuit that receives the first address signal, and the second address signal and which selects the redundant bit line when the first address signal coincides with the second address signal. The semiconductor memory device further includes a logic circuit, which receives the first address signal and the second address signal, which selects one of the normal bit lines according to the first address signal, and which is inhibited from selecting the normal bit line corresponding to the second address signal.

The above and further objects and novel features of the invention will more fully appear from the following detailed description, appended claims, and the accompanying drawings.

DETAILED DESCRIPTION OF THE PREFERRED EMBODIMENTS

Figure 1:
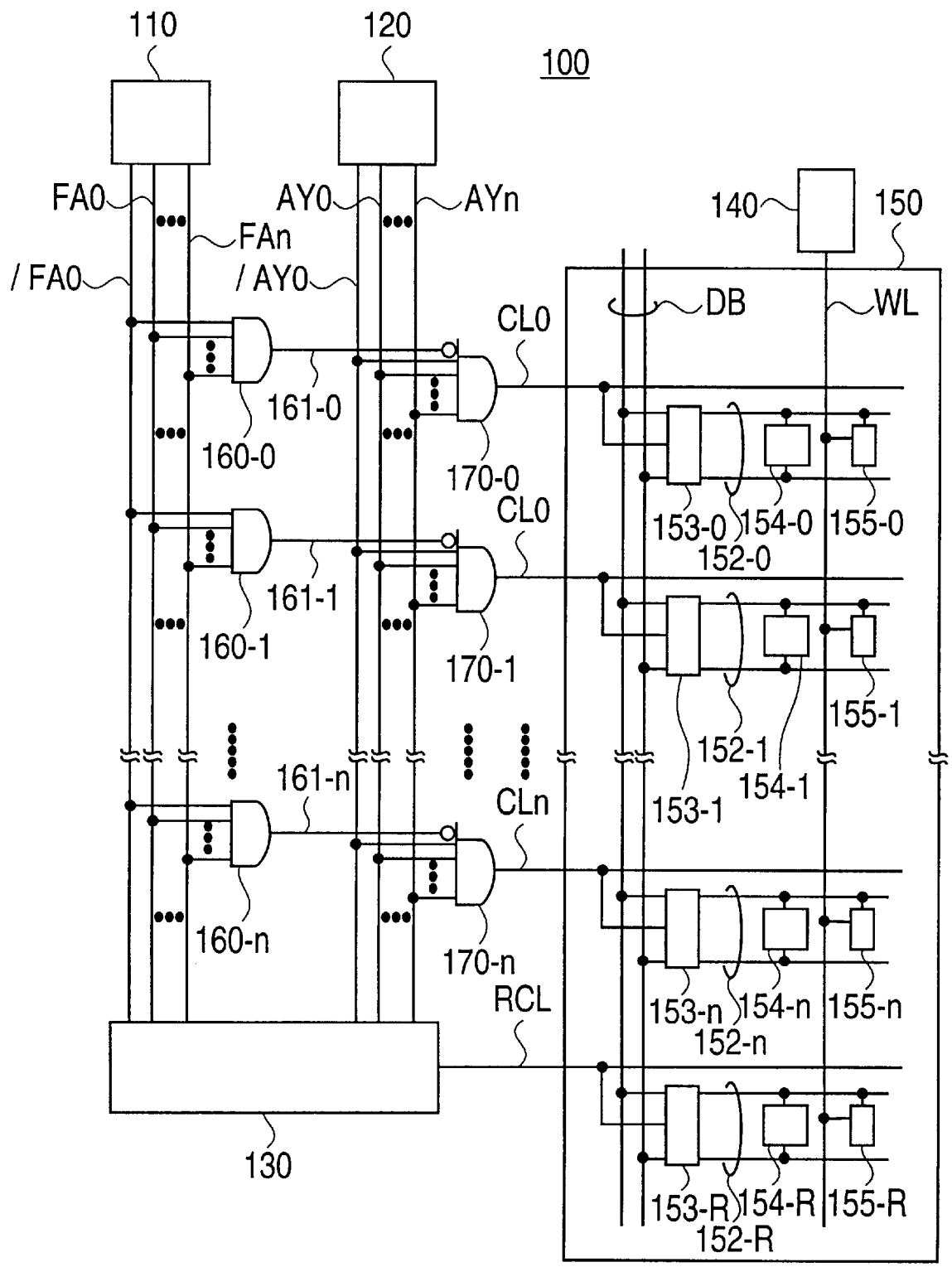
FIG. 1 is a circuit diagram showing a semiconductor memory device according to a first preferred embodiment of the present invention.

A semiconductor memory device according to preferred embodiments of the present invention will be explained hereinafter with reference to FIG. 1 through FIG. 5. In order to simplify explanations, like elements are given like or corresponding reference numerals through this specification and figures.

First Preferred Embodiment

FIG. 1 is a circuit diagram showing a semiconductor memory device according to a first preferred embodiment of the present invention.

As shown in FIG. 1, the semiconductor memory device 100 primarily comprises a fuse ROM 110, a column address buffer 120, a coincidence circuit 130, a row decoder 140, a memory cell array 150, AND circuits 160-0 through 160-n, and AND circuits 170-0 through 170-n.

The fuse ROM 110 stores address information of a defective memory cell. For example, the address information includes a column address of the defective memory cell. The address information is called a defect column address signal or a redundant column address signal.

The column address buffer 120 detects an external address information (i.e., an external column address signal) applied thereto and amplifies it.

The coincidence circuit 130 is connected to the fuse ROM 110 and the column address buffer 120. The coincidence circuit 130 detects whether the defect column address signal output from the fuse ROM 110 coincides with a column address signal output from the column address buffer 120.

The AND circuits 160-0 through 160-n are connected to the fuse ROM 110 and receive the defect column address signal /FA0, FA0, . . . , /FAn, FAn output from the fuse ROM 110. (In this description the designator "/" indicates an inverse signal. For example, the signal /FA0 has a voltage potential that is the inverse of a voltage potential of the signal FA0.) Output terminals 161-0 through 161-n of the AND circuits are electrically connected to the AND circuits 170-0 through 170-n. In other words, the inverse signal of the defect column address signal is applied to the AND circuits 170-0 through 170-n. The AND circuits 160-0 through 160-n control an output operation of the AND circuits 170-0 through 170-n.

The AND circuits 170-0 through 170-n receive the column address signal /AY0, AY0, . . . , /AYn, AYn output from the column address buffer 120 (as above, the designator "/" indicates an inverse signal, so /AY0 has a voltage potential that is the inverse of a voltage potential of the signal AY0.) and also receive the inverse signal of the defect column address signal output from the AND circuits 160-0 through 160-n. Output terminals of the AND circuits 170-0 through 170-n are connected to column lines CL0 through CLn, respectively The memory cell array 150 includes normal bit line pairs 152-0 through 152-n and a redundant bit line pair 152-R, a word line WL, and normal memory cells 155-0 through 155-n and a redundant memory cell 155-R. The memory cell array 150 also includes sense amplifiers 154-0 through 154-n for the normal memory cells, a sense amplifier 154-R for the redundant memory cell, column switches 153-0 through 153-n for normal memory cells, and column switch 153-R for redundant memory cell.

The word line WL is disposed so as to cross the bit line pairs 152-0 through 152-n and 152-R and is activated (selected) by the row decoder 140. Only one word line WL is shown in FIG. 1 in order to simplify the explanation. However, other word lines are arranged in the memory cell array 150 with corresponding memory cells.

Each of the memory cells 155-0 through 155-n, 155-R is arranged at a respective intersection where the word line WL crosses a respective bit line pair. Each memory cell 155-0 through 155-n and 155-K stores information (i.e., data).

The sense amplifiers 154-0 through 154-n and 154-R are connected to the bit line pairs 152-0 through 152-n and 152-R, respectively, and amplify small signal levels output from the memory cells 155-0 through 155-n and 155-R.

The column switches 153-0 through 153-n and 153-R are activated by the column lines CL0 through CLn and the redundant column line RCL, respectively. Activated column switches 153-0 through 153-n and 153-R electrically connect the bit line pairs 152-0 through 152-n and 152-R to a data bus DB.

Figure 2:
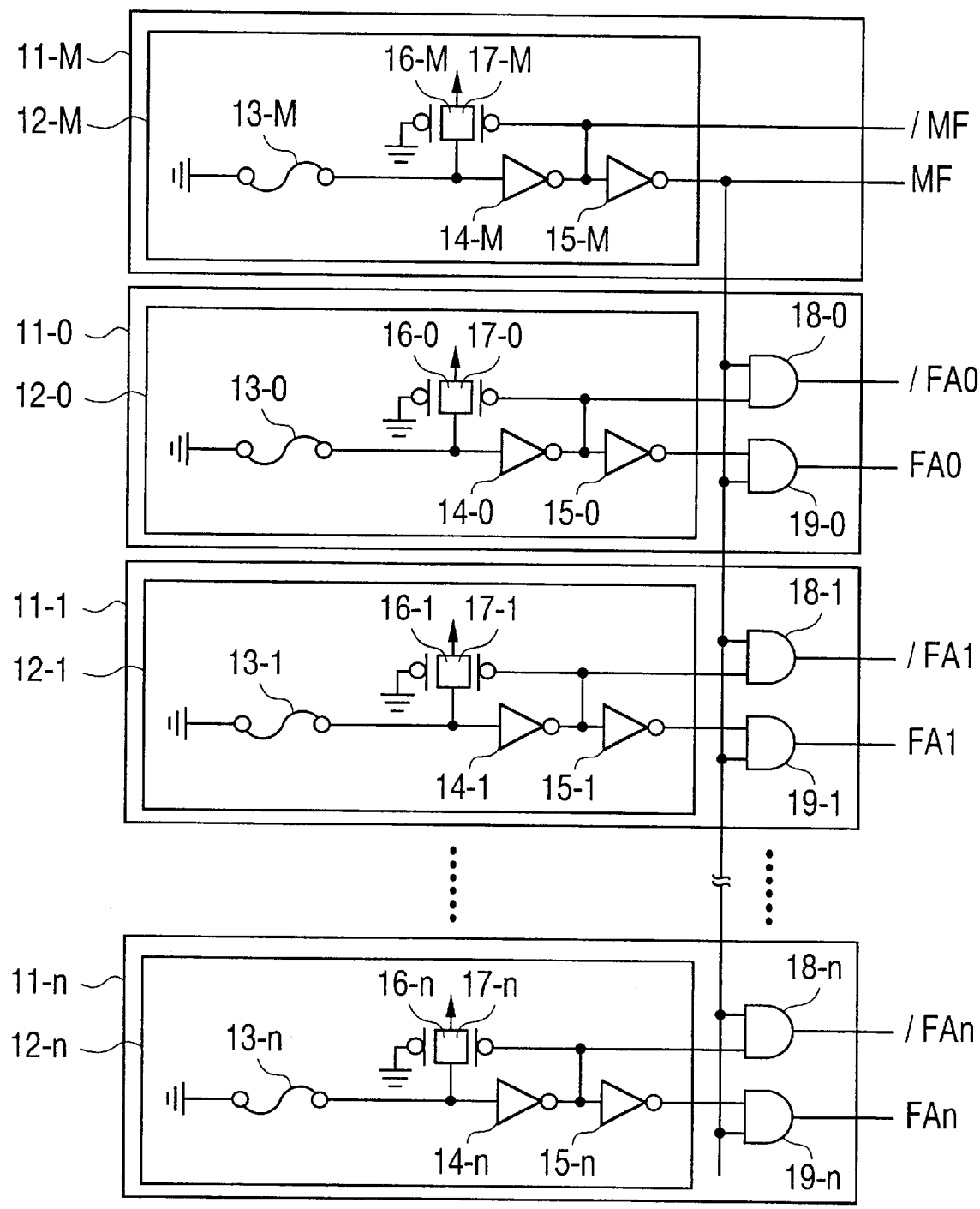
FIG. 2 is a circuit diagram showing the fuse ROM from FIG. 1 according to a first preferred embodiment of the present invention.

FIG. 2 is a circuit diagram showing the fuse ROM 110 according to the first preferred embodiment of the present invention.

The fuse ROM 110 is made up of a main fuse ROM 11-M and sub fuse ROMs 11-0 through 11-n. The main fuse ROM 11-M stores information as to whether address information of the defective memory cell is programmed in the fuse ROM 110. The sub fuse ROMs 11-0 through 11-n store address information of a defective memory cell.

The main fuse ROM 11-M comprises a fuse ROM cell 12-M that has first and second output terminals. The first and second output terminals output a main fuse ROM signal /MF, MF, respectively.

The fuse ROM cell 12-M is made up of a fuse 13-M, inverters 14-M, 15-M, a PMOS 16-M, and a PMOS 17-M. The fuse 13-M may be cut by a laser or the like. The inverters 14-M and the PMOS 17-M serve as a latch circuit for latching information after the fuse 13-M is cut. The fact that address information of a defective memory cell is programmed in the fuse ROM 11-M may be determined by checking the main fuse ROM signal /MF, MF.

One terminal of the fuse 13-M is grounded. An input terminal of the inverter 14-M is connected to another terminal of the fuse 13-M, a drain of the PMOS transistor 16-M, and a drain of the PMOS transistor 17-M.

An output terminal of the inverter 14-M is connected to the first output terminal of the fuse ROM cell 12-M. Consequently, a signal output from the inverter 14-M functions as the main fuse ROM signal /MF.

The output terminal of the inverter 14-M is coupled to the second output terminal of the fuse ROM cell 12-M through the inverter 15-M. Therefore, a signal output from the inverter 15-M serves as the main fuse ROM signal MF. Furthermore, the output terminal of the inverter 14-M is also connected to a gate of the PMOS transistor 17-M.

A source of the PMOS transistor 16-M and a source of the PMOS transistor 17-M are commonly connected to a voltage supply (e.g., 5 volts). The drain of the PMOS transistor 16-M and the drain of the PMOS transistor 17-M are commonly connected to the input terminal of the inverter 14-M.

Since the fuse ROM cell 12-M has structure described above, it functions as follows.

In the case where the fuse 13-M has not been cut, since the input terminal of the inverter 14-M is grounded, the inverter 14-M outputs a high level signal. (i.e., a "H" level). Therefore, a first output signal of the fuse ROM cell 12-M (the main fuse ROM signal /MF) goes to the H level and a second output signal of the fuse ROM cell 12-M (the main fuse ROM signal MF) goes to a low level (i.e., a "L" level).

In the case where the fuse 13-M has been cut, since the PMOS transistor 17-M enters the ON state, the inverter 14-M outputs the L level. Therefore, the first output signal of the fuse ROM cell 12-M (the main fuse ROM signal /MF) goes to the L level and the second output signal of the fuse ROM cell 12-M (the main fuse ROM signal MF) goes to the H level.

The output signal of the second output terminal of the fuse ROM cell 12-M (the main fuse ROM signal MF) controls output signals of the sub fuse ROMs 11-0 through 11-n. That is, when the second output signal of the fuse ROM cell 12-M is in the L level, all of the defect column address signals /FA0, FA0, . . . , /FAn, are set to the L levels. Accordingly, setting the second output signal of the fuse ROM cell 12-M to the L level (i.e., when the fuse 13-M in the main fuse ROM 11-M is not cut) indicates that information of the defective memory cell has not been programmed yet in the fuse ROM 110.

The sub fuse ROM 11-0, which stores information of the redundant column address signal /FA0, FA0, includes a fuse ROM cell 12-0, an AND circuit 18-0, and an AND circuit 19-0. The fuse ROM cell 12-0 has the same structure as the fuse ROM cell 12-M. Therefore, an explanation of them is omitted here.

A first output terminal of the fuse ROM cell 12-0 is connected to the AND circuit 18-0. A second output terminal of the fuse ROM cell 12-0 is connected to the AND circuit 19-0. In the case where the fuse 13-M in the main fuse ROM 11-M has been cut, since the second output signal of the fuse ROM cell 12-M is at the H level, the AND circuit 18-0 and the AND circuit 19-0 are enabled. Accordingly, voltage levels of the redundant column address signals /FA0, FA0 output from the AND circuit 18-0 and the AND circuit 19-0 coincide with voltage levels of the first and second output terminals of the fuse ROM cell 12-0, respectively.

In the case where the fuse 13-M in the main fuse ROM 11-M has not been cut, since the second output signal of the fuse ROM cell 12-M is at the L level, the AND circuit 18-0 and the AND circuit 19-0 are disabled. Therefore, voltage levels of the redundant column address signals /FA0, FA0 output from the AND circuit 18-0 and the AND circuit 19-0 are set to the L levels.

The sub fuse ROM 11-1 through 11-n, which store information of defect column address signal /FA1, FA1, . . . , /FAn, FAn, have the same structure as the sub fuse ROM 11-0. Therefore, their explanations are omitted here.

Figure 3:
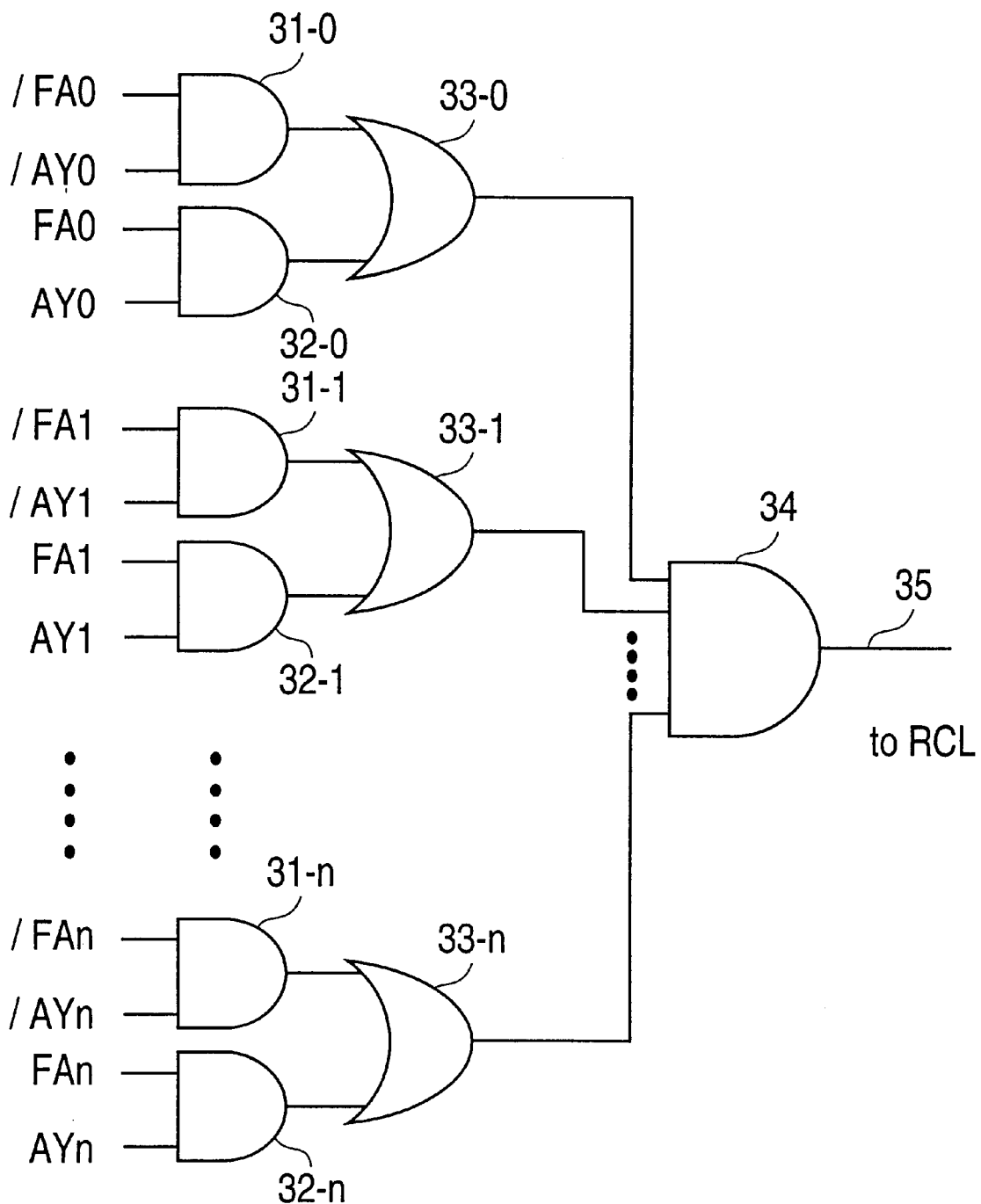
FIG. 3 is a circuit diagram showing the coincidence circuit from FIG. 1 according to a first preferred embodiment of the present invention.

FIG. 3 is a circuit diagram showing the coincidence circuit 130 according to the first preferred embodiment of the present invention.

The coincidence circuit 130 comprises of AND circuits 31-0 through 31-n, 32-0 through 3-n, OR circuits 33-0 through 33-n, and an AND circuit 34.

An AND circuit 31-k (where k is an integer equal to or greater than 0 and equal to or smaller than n.) receives a defect column address signal /FAk and a column address signal /AYk. An AND circuit 32-k receives a defect column address signal FAk and a column address signal AYk. An OR circuit 33-k receives an output signal of the AND circuit 31-k and the AND circuit 32-k. The OR circuit 33-k outputs the H level only when the voltage level of the defect column address signal /FAk coincides with that of the column address signal /AYk and the voltage level of the defect column address signal FAk coincides with that of the column address signal AYk.

An output terminal of an OR circuit 33-k (k is an integer equal to or greater than 0 and equal to or smaller than n.) is connected to the AND circuit 34. Only when the voltage levels of the redundant address signal /FA0, FA0, . . . , /FAn, FAn coincide with the voltage levels of the column address signals /AY0, AY0, . . . , /AYn, AYn, the AND circuit 34 outputs the H level.

Next, a replacement operation of a defective memory cell in a data read mode will be explained hereinafter. In the following explanation, the memory cell (e.g., the memory cell 155-1) associated with the column line CL1 has a defect. Therefore, the address signal that designates the column line CL1 is defined as the defect column address signal (redundant column address signal). The fuse ROM 110 stores the address information of the column line CL1 as the defect column address.

When the word line WL is activated by the row decoder 140, the memory cells (i.e., the memory cells 155-0 through 155-n, 155-R) associated with the word line WL are selected and activated. Then, data in the selected memory cells are read out on the bit lines (i.e., the bit line pairs 152-0 through 152-n, 152-R). Thereafter, the sense amplifiers 154-0 through 154-n, 154-R are activated at a predetermined time after the memory cells are activated. Therefore, small voltage differences that appear between respective bit line pairs are amplified by corresponding sense amplifiers 154-0 through 154-n, 154-R.

Now, since the address of the column line CL1 is defined as the defect column address, an output signal of the AND circuit 160-1, which corresponds to the column line CL1, is set to the H level according to information of the defect column address from the fuse ROM 110. Therefore, the AND circuit 170-1 is not activated due to the H level of the output signal of the AND circuit 160-1 even though the AND circuit 170-1 receives the column address signal (i.e., /AY0, /AYn, . . . , AYo, AYn) that selects the column line CL1.

On the other hand, the coincidence circuit 130 outputs the H level when receiving the column address signal (i.e., /AY0, /AYn, . . . , AYo, AYn) for selecting the column line CL1 output from the column address buffer 120. Therefore, the redundant column line RCL is activated by an output signal having the H level of the coincidence circuit 130. Then, the column switch 153-R is activated in response to the activated redundant column line RCL. Therefore, the data on the bit line pair 152-R is transferred to the data bus DB through the activated column switch 153-R.

As described above, even if the column address buffer 120 outputs the column address signal (i.e., /AY0, /AYn, . . . , AYo, AYn) for selecting the column line associated with the defective memory cell, the redundant column line RCL is selected. Accordingly, the replacement operation of the defective memory cell may be carried out. At this time, the column line associated with the defective memory cell is not activated even if the column address buffer 120 outputs the column address signal (i.e., /AY0, /AYn, . . . , AYo, AYn) for selecting the column line associated with the defective memory cell due to the redundant address signal /FA0, FA0, . . . , /FAn, FAn programmed in the fuse ROM 110. This means that when once the information of the defective memory cell is programmed in the fuse ROM 110, the column line associated with the defective memory cell is not activated. Therefore, it is not necessary to delay an activation time of the redundant column line RCL. As a result, an access time when using the redundant column line RCL (i.e., the replacement operation for the detective memory cell) can be reduced.

Second Preferred Embodiment

A semiconductor memory device according to a second preferred embodiment of the present invention will be explained hereinafter with reference to FIG. 4 and FIG. 5.

Figure 4:
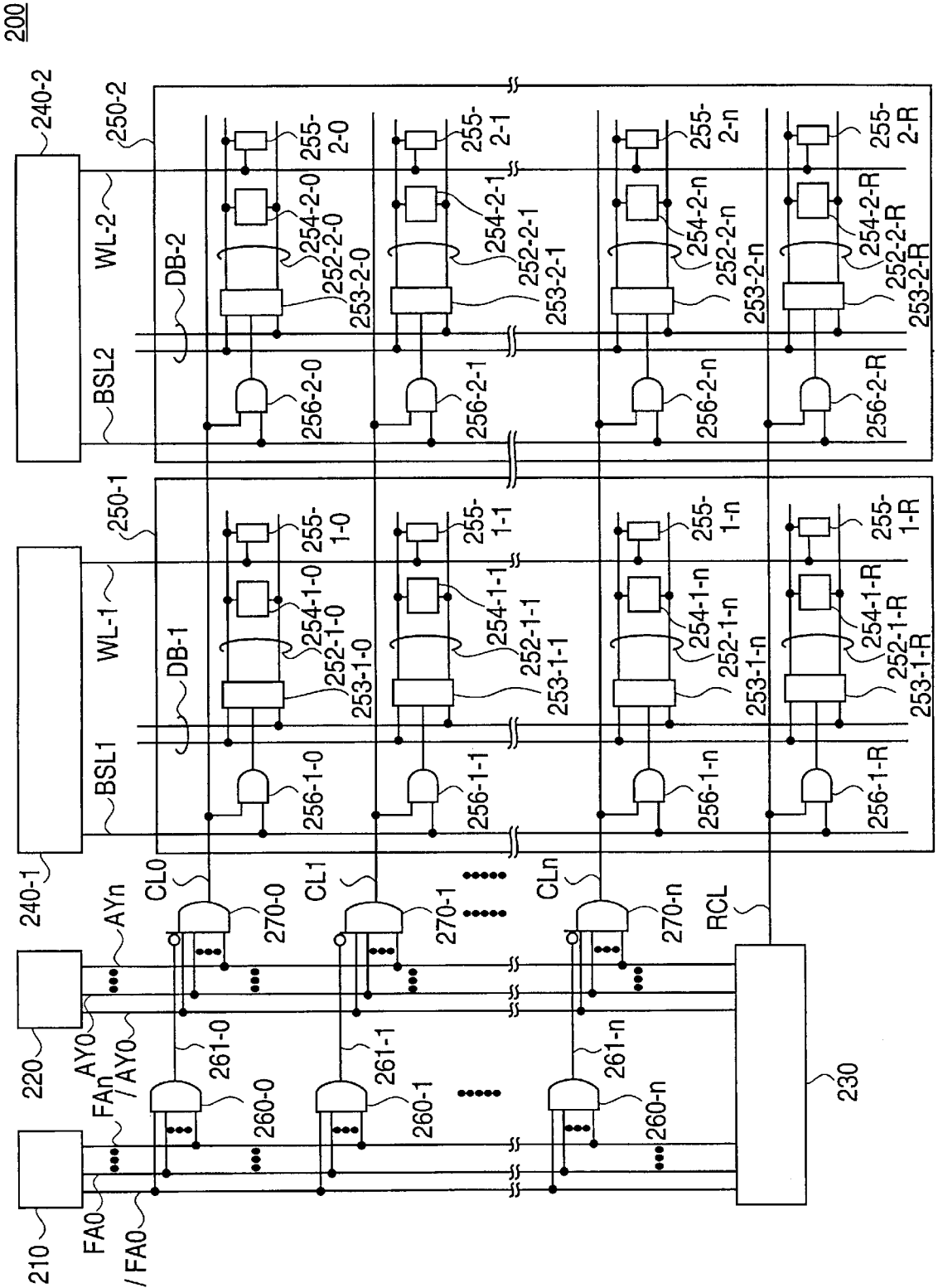
FIG. 4 is a circuit diagram showing a semiconductor memory device according to a second preferred embodiment of the present invention.

FIG. 4 is a circuit diagram showing a semiconductor memory device according to the second preferred embodiment of the present invention.

As shown in FIG. 4, the semiconductor memory device 200 includes a fuse ROM 210, a column address buffer 220, a coincidence circuit 230, a row decoder 240-1, a row decoder 240-2, a memory cell array 250-1, a memory cell array 250-2, AND circuits 270-0 through 270-n, and AND circuits 260-0 through 260-n.

Since the semiconductor memory device 200 has two row decoders 240-1, 240-2 and two memory cell arrays 250-1, 250-2, the fuse ROM 210 has a different structure as the fuse ROM 110 of the first preferred embodiment.

Although in the second preferred embodiment of the present invention, a semiconductor memory device having two row decoders and two memory cell arrays is described by way of example, the present invention is not limited to such a structure. The present invention may also be applied to a semiconductor memory device having three or more row decoders and three or more memory cell arrays.

As shown in FIG. 4, since the column address buffer 220, the coincidence circuit 230, AND circuits 270-0 through 270-n, and AND circuits 260-0 through 260-n, a column lines CL0 through CLn, and a redundant column line RCL have substantially the same function, substantially the same structure, and substantially the same connection as those of corresponding elements of the first preferred embodiment, their explanations are omitted here.

The fuse ROM 210, the row decoders 240-1, 240-2, and the memory cell arrays 250-1, 250-2, which are distinctive features of the second preferred embodiment of the present invention, will be explained below.

The memory cell array 250-1 includes normal bit line pairs 252-1-0 through 252-1-n and a redundant bit line pair 252-1-R, a word line WL-1, and normal memory cells 255-1-0 through 255-1-n and a redundant memory cell 255-1-R.

The memory cell array 250-1 also includes sense amplifiers 254-1-0 through 254-1-n for the normal memory cells, sense amplifier 254-1-R for the redundant memory cell, and AND circuits 256-1-0 through 256-1-n and 256-1-R. The memory cell array 250-1 further includes column switches 253-1-0 through 253-1-n for the normal memory cells and a column switch 253-1-R for the redundant memory cell.

The word line WL-1 is disposed so as to cross the bit line pairs 252-1-0 through 252-1-n, 252-1-R and is activated (selected) by the row decoder 240-1. Only one word line WL-1 is shown in FIG. 4 in order to simplify the explanation, however, other word lines are arranged in the memory cell array 250-1 with corresponding memory cells.

Each of the memory cells 255-1-0 through 255-1-n, 255-1-R is arranged at a respective intersection where the word line WL-1 crosses a respective bit line pair. Each of the memory cells 255-0 through 255-n, 255-R stores information (i.e., data).

The sense amplifiers 254-0 through 254-n, 254-R are connected to the bit line pairs 252-1-0 through 252-1-n, 252-1-R respectively and amplify small signal levels output from the memory cells 255-1-0 through 255-1-n, 255-1-R.

The AND circuits 256-1-0 through 256-1-n receive a block select signal BSL1 output from the row decoder 240-1 and output signals output from the column lines CL0 through the CLn.

The AND circuits 256-1-R receives the block select signal BSL1 and an output signal (i.e., the redundant column signal) output from the coincidence circuit 230.

The column switches 253-1-0 through 253-1-n, 253-1-R are activated by output signals of the AND circuits 256-1-0 through 256-1-n, 256-1-R, respectively. Activated column switches 253-1-0 through 253-1-n, 253-1-R electrically connect the bit line pairs 252-1-0 through 252-1-n, 252-1-R to a data bus DB-1.

The difference between the memory cell array 250-1 of the second preferred embodiment and the memory cell array 150 of the first preferred embodiment resides in the AND circuits 256-1-0 through 256-1-n, 256-1-R. The AND circuit 256-1-0 which corresponds to the column line CL0 receives the block select signal BSL1. Therefore, when the block select signal BSL1 is in the L level, the column line CL0 is not activated. Operations of the AND circuits 256-1-1 through 256-1-n, 256-1-R which correspond to the column line CL1 through CLn, the redundant column line RCL are substantially the same as the AND circuit 256-1-0. Therefore, when the block select signal BSL1 is in the L level, the whole memory cell array 250-1 is not activated.

The memory cell array 250-2 has substantially the same structure as the memory cell array 250-1. In other words, the memory cell array 250-2 has AND circuits 256-2-0 through 256-2-n, 256-2-R which correspond to the AND circuits 256-1-0 through 256-1-n, 256-1-R of the memory cell array 250-1, respectively Furthermore, the memory cell array 250-2 has a row decoder 240-2 which outputs a block select signal BSL2. Therefore, when the block select signal BSL9 is in the L level, the whole memory cell array 250-2 is not activated.

As a result, the memory cell arrays 250-1, 250-2 may be selectively activated by the block select signals BSL1, BSL2.

Only one word line WL-2 is shown in FIG. 4 in order to simplify the explanation, however, other word lines are arranged in the memory cell array 250-2 with corresponding memory cells.

Figure 5:
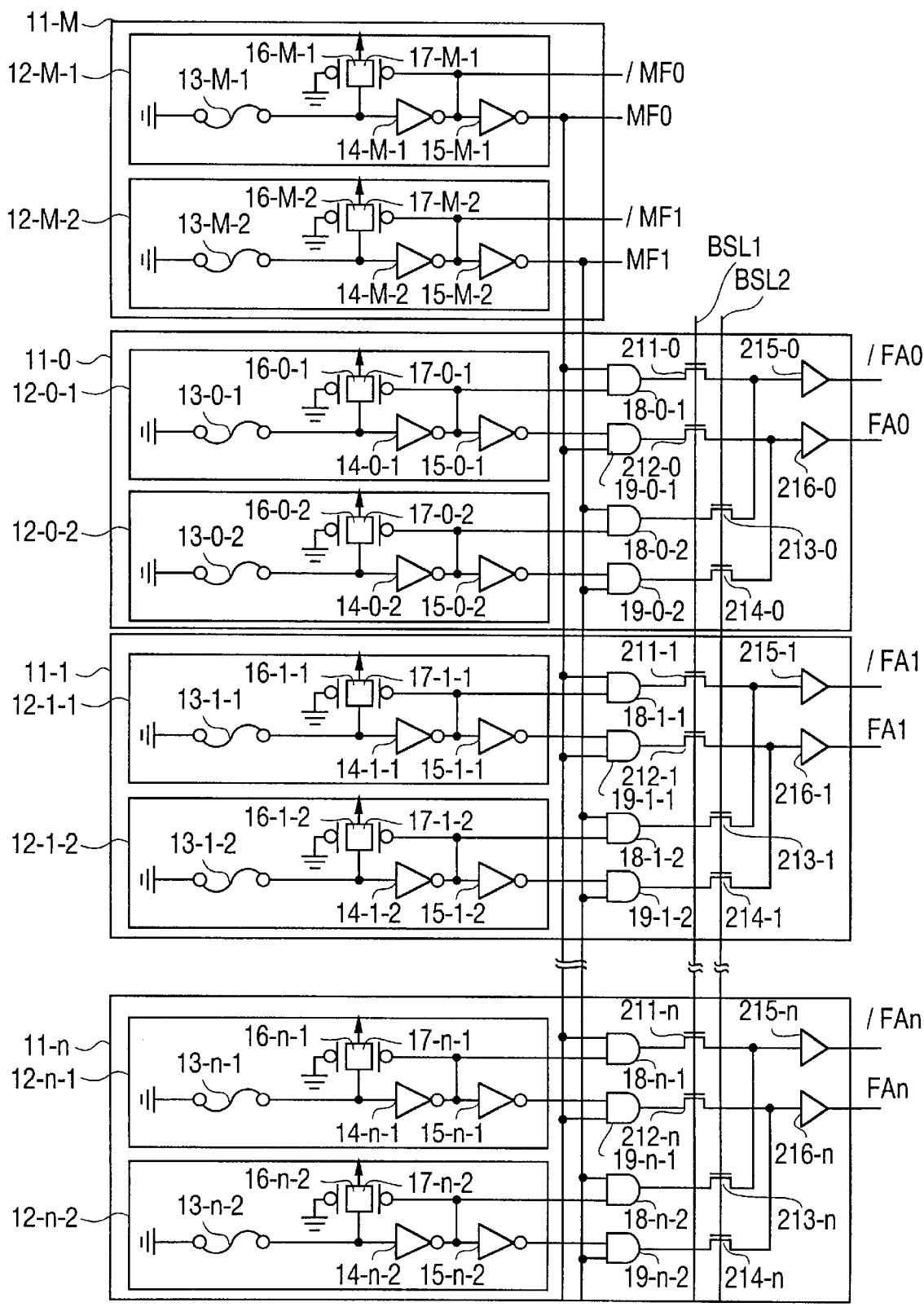
FIG. 5 is a circuit diagram showing the fuse ROM from FIG. 4 according to a second preferred embodiment of the present invention.

FIG. 5 is a circuit diagram showing the fuse ROM 210 according to the second preferred embodiment of the present invention.

The differences between the fuse ROM 210 and the fuse ROM 110 of the first preferred embodiment is as follows.

The fuse ROM 210 has a main fuse ROM 11-M and sub fuse ROMs 11-0 through 11-n which are store address information of defective memory cells in the memory cell arrays 250-1, 250-2. The fuse ROM 210 selectively outputs the stored address information as the defect column address signal /FA0, FA0, . . . , /FA1, FAn (i.e., the column address of the defective memory cell).

The fuse ROM 210 is made up of the main fuse ROM 11-M and sub fuse ROMs 11-0 through 11-n. The main fuse ROM 11-M stores information as to whether address information of a defective memory cell is programmed in the fuse ROM 210. The sub fuse ROMs 11-0 through 11-n store address information of the defective memory cell.

The main fuse ROM 11-M includes a fuse ROM cell 12-M-1 for storing information of the memory cell 250-1 and a fuse ROM cell 12-M-2 for storing information of the memory cell 250-2. The fuse ROM cell 12-M-1 and the fuse ROM cell 12-M-2 have substantially the same structure.

The fuse ROM cell 12-M-1 has first and second output terminals. The first and second output terminals output a main fuse ROM signal /MF0, MF0.

The fuse ROM cell 12-M-2 has first and second output terminals. The first and second output terminals thereof output a main fuse ROM signal /MF1, MF1.

The sub fuse ROM 11-0, which stores address information of the defective memory cell, includes a fuse ROM cell 12-0-1 for storing address information with respect to the memory cell array 250-1, a fuse ROM cell 12-0-2 for storing address information with respect to the memory cell array 250-2, AND circuits 18-0-1, 19-0-1, 18-0-2, 19-0-2.

The sub fuse ROM 11-0 also includes n-channel type MOS transistors (hereinafter an NMOS) 211-0, 212-0 each of which has a gate controlled by the block select signal BSL1. The sub fuse ROM 11-0 also includes an NMOSs 213-0, 214-0 each of which has a gate controlled by the block select signal BSL2. The sub fuse ROM 11-0 further includes buffer circuits 215-0, 216-0.

The AND circuit 18-0-1 receives a first output signal of the fuse ROM cell 12-0-1 and the main fuse ROM signal MF0. An output terminal of the AND circuit 18-0-1 is coupled to an input terminal of the buffer circuit 215-0 through the NMOS 211-0.

The AND circuit 19-0-1 receives a second output signal of the fuse ROM cell 12-0-1 and the main fuse ROM signal MF0. An output terminal of the AND circuit 19-0-1 is coupled to an input terminal of the buffer circuit 216-0 through the NMOS 212-0.

The AND circuit 18-0-2 receives a first output signal of the fuse ROM cell 12-0-2 and the main fuse ROM signal MF1. An output terminal of the AND circuit 18-0-2 is coupled to an input terminal of the buffer circuit 215-0 through the NMOS 213-0.

The AND circuit 19-0-2 receives a second output signal of the fuse ROM cell 10-0-2 and the main fuse ROM signal MF1. An output terminal of the AND circuit 19-0-2 is coupled to an input terminal of the buffer circuit 216-0 through the NMOS 214-0.

An output signal of the buffer circuit 215-0 serves as the defect column address signal /FA0. An output signal of the buffer circuit 216-0 functions as the defect column address signal FA0.

The sub fuse ROMs 11-1 through 11-n store address information of the redundant memory cell respectively. The sub fuse ROMs 11-1 through 11-n each have a structure similar to that of the sub fuse ROM 11-0. Therefore, their explanations are omitted here.

The address information of the defective memory cell for the memory cell array 250-1 and that for the memory cell array 250-2 may be selectively output as the defect column address signal /FA1, FA1, . . . , /FAn, FAn from the buffer circuits 215-0 through 215-n, 216-0 through 216-n in response to the block select signals BSL1 and BSL2.

In other words, when the memory cell array 250-1 is activated, the block select signal BSL1 is in the H level. Therefore, the NMOSs 211-0 through 211-n, 212-0 through 212-n enter the ON states. Thus the address information of the defective memory cell programmed in the sub fuse ROM 12-0-1 through 12-n-1 is output as the defect column address signal /FA1, FA1, . . . , /FAn, FAn.

When the memory cell array 250-2 is activated, the block select signal BSL2 is in the H level. Therefore, the NMOSs 213-0 through 213-n, 214-0 through 214-n enter the ON states. Thus the address information of the defective memory cell programmed in the sub fuse ROM 12-0-2 through 12-n-2 is output as the defect column address signal /FA1, FA1, . . . , /FAn, FAn.

Next, a replacement operation of a defective memory cell in a data read mode will be explained. In this explanation, the memory cell 255-1-1 and the memory cell 255-2-0 each have a defect.

Therefore, the address signals that designate the column lines CL0 and CL1 are defined as defect column address signals (a defect column address signal is also called a redundant column address signal). Now, the fuse ROM 210 stores the address information of the column line CL0 and CL1 as the defect column addresses.

When the word line WL-1 is activated by the row decoder 240-1, the memory cells associated with the word line WL-1 (i.e., the memory cells 255-1-0 through 255-1-n, 255-1-R) are selected and activated. Then, data in the selected memory cells are read out onto the bit lines (i.e, the bit line pairs 252-1-0 through 252-1-n, 252-1-R). Thereafter, the sense amplifiers 254-1-0 through 254-1-n, 254-1-R are activated at a predetermined time after the memory cells are activated. Therefore, small voltage differences that appear between respective bit line pairs are amplified by corresponding sense amplifiers 251-1-0 through 254-1-n, 254-1-R.

Thereafter, the block select signal BSL1 is activated (i.e., the block select signal BSL1 is set to the H level).

Since the address of the column line CL1 is defined as the defect column address, an output signal of the AND circuit 260-1 on the output terminal 261-1, which corresponds to the column line CL1, is set to the H level according to information of the defect column address from the fuse ROM 210. Therefore, the AND circuit 270-1 is not activated due to the H level on the output terminal 261-1 even if the AND circuit 270-1 receives the column address signal (i.e., /AY0, /AYn, . . . , AYo, AYn), which selects the column line CL1. Consequently, the AND circuit 256-1-1 is also not activated even if the block select signal BSL1 is at the H level.

On the other hand, the coincidence circuit 230 outputs the H level when receiving the column address signal (i.e., /AY0, /AYn, . . . , AYo, AYn) for selecting the column line CL1 output from the column address buffer 220. Therefore, the redundant column line RCL is activated by an output signal having the H level output by the coincidence circuit 230.

Since the block select signal BSL1 is in the H level, the AND circuit 256-1-R outputs a signal having the H level. Therefore, the column switch 253-1-R is activated in response to the output signal of the AND circuit 256-1-R. Therefore, the data on the bit line pair 252-1-R is transferred to the data bus DB-1 through the activated column switch 253-1-R.

Next, when the word line WL-2 is activated by the row decoder 240-2, the memory cells associated with the word line WL-2 (i.e., the memory cells 255-2-0 through 255-2-n, 255-2-R) are selected and activated. Then, data in the selected memory cells are read out on the bit lines (i.e., the bit line pairs 252-2-0 through 252-2-n, 252-2-R). Thereafter, the sense amplifiers 254-2-0 through 254-2-n, 254-2-R are activated at a predetermined time after the memory cells are activated. Therefore, small voltage differences that appear between respective bit line pairs are amplified by corresponding sense amplifiers 254-2-0 through 254-2-n, 254-2-R.

Thereafter, the block select signal BSL2 is activated (i.e., the block select signal BSL2 is set to the H level).

Since the address of the column line CL0 is defined as the defect column address, an output signal of the AND circuit 270-0 on the output terminal 261-0. which corresponds to the column line CL0, is set to the H level according to information of the defect column address. Therefore, the AND circuit 270-0 is not activated due to the H level on the output terminal 261-0 even if the AND circuit 270-0 receives the column address signal (i.e., /AY0, /AYn, . . . , AYo, AYn) that selects the column line CL0. Consequently, the AND circuit 256-9-0 is also not activated even if the block select signal BSL2 is in the H level.

On the other hand, the coincidence circuit 230 outputs the H level when receiving the column address signal (i.e., /AY0, /AYn, . . . , AYo, AYn) for selecting the column line CL0 output from the column address buffer 220. Therefore, the redundant column line RCL is activated by the output signal having the H level of the coincidence circuit 230.

Since the block select signal BSL2 is at the H level, the AND circuit 256-2-R outputs a signal having the H level. Therefore, the column switch 253-2-R is activated in response to the output signal of the AND circuit 256-2-R. Therefore, the data on the bit line pair 252-2-R is transferred to the data bus DB-2 through the activated column switch 253-2-R.

As described above, in the case that the memory cell arrays 250-1, 250-2 share the column line CL0 through CLn and the redundant column line RCL, the address information of the defective memory cell in the memory cell array 250-1, which is programmed in the fuse ROM 210, and the address information of the defective memory cell in the memory cell array 250-2, which is programmed in the fuse ROM 210, may be selectively output as the redundant address signal /FA0, FA0, . . . , /FAn, FAn by using the block select signals BSL1, BSL2. Therefore, the number of address lines that receive the redundant address signal /FA0, FA0, . . . , /FAn, FAn can be reduced. As a result, a chip area of the semiconductor memory device can be reduced.

While the preferred form of the present invention has been described, it is to be understood that modifications will be apparent to those skilled in the art without departing from the spirit of the invention. The scope of the invention is to be determined solely by the following claims.

What is claimed is:

1. A semiconductor memory device comprising:
   a plurality of word lines;
   a plurality of normal bit lines;
   a redundant bit line:
   a plurality of normal memory cells each of which is coupled to one of said word lines and one of said normal bit lines and each of which stores data;
   a plurality of redundant memory cells each of which is coupled to one of said word lines and said redundant bit line;
   a first address signal output circuit outputting a first address signal which indicates an address of one of said normal bit lines;
   a second address signal output circuit outputting a second address signal indicating an address of one of said normal bit lines in which a defective memory cell is coupled;
   a coincidence circuit which receives the first address signal and the second address signal and which selects said redundant bit line when the first address signal coincides with the second address signal; and
   a logic circuit which receives the first address signal and the second address signal which selects one of said normal bit lines according to the first address signal but which is inhibited from selecting said normal bit line corresponding to the second address signal.

2. A semiconductor memory device as set forth claim 1, wherein said logic circuit comprises:
   a first logic circuit, coupled to said second address signal output circuit, which outputs an inhibit signal; and
   a second logic circuit, coupled to said first address signal output circuit and said first logic circuit, which selects said one of said normal bit lines according to the first address signal and which is inhibited to select said normal bit lines coupling to the defective memory cell according to the inhibit signal.

3. A semiconductor memory device as set forth claim 2, wherein said first logic circuit comprises a plurality of first AND gates having a plurality of input terminals connected to said second address signal output circuit and each having an output terminal.

4. A semiconductor memory device as set forth claim 3, wherein said second logic circuit comprises a plurality of second AND gates each having a plurality of input terminals connected to said first address signal output circuit and the output terminal of one of the first AND gates of said first logic circuit.

5. A semiconductor memory device as set forth claim 1, wherein the first address signal is a column address signal and wherein the second address signal is a defect column address signal.

6. A semiconductor memory device as set forth claim 1, wherein said second address signal output circuit includes a plurality of fuse circuits each having a fuse, said second address signal output circuit outputting the second address signal according to states of the fuses.

7. A semiconductor memory device comprising:
   a first memory cell array including:
      a plurality of first word lines;
      a plurality of first normal bit lines;
      a first redundant bit line;
      a plurality of first normal memory cells each of which is coupled to one of said first word lines and one of said first normal bit lines and each of which stores data;
      a plurality of first redundant memory cells each of which is coupled to one of said first word lines and said first redundant bit line;
      a plurality of first normal bit line select circuits each of which is coupled to one of said first normal bit lines and each of which receives a normal column select signal and a first memory block select signal and each of which selects one of said first normal bit lines according to the normal column select signal and the first memory block select signal; and
      a first redundant bit line select circuit which is coupled to said first redundant bit line and which receives a redundant column select signal and the first memory block select signal, and which selects said first redundant bit line according to the redundant column select signal and the first memory block select signal;
   a second memory cell array including:
      a plurality of second word lines;
      a plurality of second normal bit lines;
      a second redundant bit line;
      a plurality of second normal memory cells each of which is coupled to one of said second word lines and one of said second normal bit lines and each of which stores data;
      a plurality of second redundant memory cells each of which is coupled to one of said second word lines and said second redundant bit line;
      a plurality of second normal bit line select circuits each of which is coupled to one of said second normal bit lines and each of which receives the normal column select signal and a second memory block select signal, and each of which selects one of said second normal bit lines according to the normal column select signal and the second memory block select signal; and
      a second redundant bit line select circuit which is coupled to said second redundant bit line and which receives the redundant column select signal and the second memory block select signal, and which selects said second redundant bit line according to the redundant column select signal and the second memory block select signal;
   a first address signal output circuit outputting a first address signal which indicates an address of one of said normal bit lines;
   a second address signal output circuit outputting a second address signal indicating an address of one of said normal bit lines in which a defective memory cell is coupled;
   a coincidence circuit which receives the first address signal and the second address signal and which outputs the redundant column select signal when the first address signal coincides with the second address signal; and
   a logic circuit which receives the first address signal and the second address signal, which outputs the normal column select signal according to the first address signal, and which is inhibited to output the normal column select signal corresponding to the defective memory cell according to the second address signal.

8. A semiconductor memory device as set forth claim 7, wherein said logic circuit comprises:
   a first logic circuit coupled to said second address signal output circuit, which outputs an inhibit signal; and
   a second logic circuit, coupled to said first address signal output circuit and said first logic circuit, which outputs the normal column select signal according to the first address signal and which is inhibited to output the normal column select signal corresponding to the defective memory cell according to the inhibit signal.

9. A semiconductor memory device as set forth claim 8, wherein said first logic circuit comprises a plurality of AND gates each of which has input terminals connected to said second address signal output circuit and each of which has an output terminal.

10. A semiconductor memory device as set forth claim 9, wherein said second logic circuit comprises a plurality of AND gates each of which has input terminals connected to said first address signal output circuit and the output terminal of one of the AND gates of said first logic circuit.

11. A semiconductor memory device as set forth claim 7, wherein the first address signal is a column address signal and wherein the second address signal is a defect column address signal.

12. A semiconductor memory device as set forth claim 7, wherein said second address signal output circuit includes:
   a first set of fuse circuits each having a first fuse; and
   a second set of fuse circuits each having a second fuse;
   wherein said second address signal output circuit selectively outputs the second address signal according to states of the first fuses or states of the second fuses.

13. A semiconductor memory device as set forth claim 12, wherein said second address signal output circuit further includes:
   a first switch, coupled between said first set of fuse circuits and said logic circuit, which electrically connects said first set of fuse circuits and said logic circuit in response to the first memory block select signal; and
   a second switch, coupled between said second set of fuse circuits and said logic circuit, which electrically connects said second set of fuse circuits and said logic circuit in response to the second memory block select signal.

14. A semiconductor memory device, comprising:
   a plurality of normal memory cells;
   a redundant memory cell;
   a plurality of normal column lines each connected to a corresponding one of the normal memory cells for accessing data stored in the corresponding normal memory cells;
   a redundant column line connected to the redundant memory cell for accessing data stored in the redundant memory cell;
   a coincidence circuit receiving a first address signal indicating an address of an addressed one of said normal column lines, and receiving a second address signal indicating an address of one of said normal column lines to which a defective memory cell is connected, and activating said redundant column line when said first and second address signals coincide;
   a logic circuit receiving the first and second address signals, the logic circuit activating said addressed normal column line, but inhibiting activation of said one of said normal column lines to which the defective memory cell is connected, said logic circuit not receiving any output signal from said coincidence circuit.

15. The semiconductor memory device of claim 14, wherein the logic circuit comprises:
   a first portion receiving the second address signal and in response thereto producing an inhibit signal; and
   a second portion receiving the inhibit signal and the first address signal and in response thereto, activating said addressed normal column line, but inhibiting activation of said one of said normal column lines to which the defective memory cell is connected.

16. The semiconductor memory device of claim 15, wherein the first address signal is a column address signal and wherein the second address signal is a defect column address signal.

17. The semiconductor memory device of claim 15, further comprising a second address signal output circuit outputting the second address signal, said second address signal output circuit including a plurality of fuses, wherein the second address signal is output according to states of said fuses.

18. The semiconductor memory device of claim 15, further comprising a second address signal output circuit outputting the second address signal, said second address signal output circuit including a plurality of fuses, wherein the second address signal is output according to states of said fuses.

19. The semiconductor memory device of claim 14, wherein the first address signal is a column address signal and wherein the second address signal is a defect column address signal.

\* \* \* \* \*